(12) United States Patent
Liu et al.

(10) Patent No.: US 9,991,116 B1
(45) Date of Patent: Jun. 5, 2018

(54) METHOD FOR FORMING HIGH ASPECT RATIO PATTERNING STRUCTURE

(71) Applicant: SHANGHAI HUALI MICROELECTRONICS CORPORATION, Shanghai (CN)

(72) Inventors: Peng Liu, Shanghai (CN); Qiyan Feng, Shanghai (CN); Yu Ren, Shanghai (CN); Yukun Lv, Shanghai (CN); Jun Zhu, Shanghai (CN); Hsusheng Chang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days. days.

(21) Appl. No.: 15/385,884

(22) Filed: Dec. 21, 2016

(30) Foreign Application Priority Data

Nov. 22, 2016 (CN) .......................... 2016 1 1048184

(51) Int. Cl.
| | |
|---|---|
| *H01L 21/027* | (2006.01) |
| *H01L 21/02* | (2006.01) |
| *H01L 21/311* | (2006.01) |
| *G03F 7/095* | (2006.01) |
| *H01L 21/3065* | (2006.01) |
| *H01L 21/308* | (2006.01) |

(52) U.S. Cl.
CPC .......... *H01L 21/0273* (2013.01); *G03F 7/095* (2013.01); *H01L 21/02271* (2013.01); *H01L 21/02282* (2013.01); *H01L 21/31138* (2013.01); *H01L 21/3065* (2013.01); *H01L 21/3081* (2013.01); *H01L 21/31116* (2013.01)

(58) Field of Classification Search
CPC ........... H01L 21/0273; H01L 21/02282; H01L 21/02271; H01L 21/31138; H01L 21/31116; H01L 21/3065; H01L 21/3081; G03F 7/095
See application file for complete search history.

(56) References Cited

U.S. PATENT DOCUMENTS

| | | | |
|---|---|---|---|
| 6,284,149 B1* | 9/2001 | Li .......................... | H01J 37/321 216/64 |
| 8,153,519 B1* | 4/2012 | Yu ....................... | H01L 21/0337 257/E21.577 |
| 2005/0116318 A1* | 6/2005 | Park .................. | H01L 27/10852 257/532 |

(Continued)

*Primary Examiner* — Anita K Alanko
(74) *Attorney, Agent, or Firm* — Tianchen LLC (57) ABSTRACT

The invention disclosed a method for forming high aspect ratio patterning structure. Firstly, forming a dielectric film ashing stop layer, a first photoresist layer, a first hard mask layer and a second photoresist layer on a semiconductor substrate in turn. A second hard mask layer having a high etch selectivity ratio with the first photoresist layer is formed on top surface and sidewall of the pattern by utilizing a low temperature chemical vapor deposition process, which can be a protect for the pattern sidewall during the later etching process of the first photoresist layer. So, the cone-shaped or the bowling-shaped photoresist morphology caused by plasma bombardment can be avoided. Therefore, the problems of the insufficient of selectivity ratio, burrs at the edge of the pattern and larger critical dimension can be solved, and the implanted ions can be well distributed according to the design of the device.

10 Claims, 5 Drawing Sheets

(56) References Cited

U.S. PATENT DOCUMENTS

| 2012/0034419 A1* | 2/2012 | Washburn | H01L 21/0332 |
| | | | 428/138 |
| 2016/0049305 A1* | 2/2016 | Mebarki | H01L 21/3088 |
| | | | 438/700 |

* cited by examiner

METHOD FOR FORMING HIGH ASPECT RATIO PATTERNING STRUCTURE

CROSS-REFERENCE TO RELATED APPLICATION

This application claims the priority benefit of China patent application serial No. 201611048184.4, filed Nov. 22, 2016. The entire contents of the above-mentioned patent application are hereby incorporated by reference herein and made a part of the specifications.

FIELD OF THE INVENTION

The present invention relates to the microelectronic field, and particularly to a method for forming high aspect ratio patterning structure.

BACKGROUND OF THE INVENTION

In some high energy ion implantation technology, the linewidth of features has required to be as small as 0.15 um, and the height of photoresist used to etch has reached a thickness of 4 um, so aspect ratio has been greater than 20. Since the above requirements have exceeded traditional lithography processes limits, a new lithography process is needed. Generally, a tri-layer photoresist process is employed in the above high aspect ratio requirement, which is comprised of an injection barrier layer, a hard mask layer, and a photoresist layer. The pattern on the photoresist layer is successively transferred to the hard mask layer and the injection barrier layer by utilizing selection ratio change of etching among the photoresist layer, the hard mask layer and the injection barrier layer.

However, in the above prior art, when the ratio between the thickness of the injection barrier layer and the critical dimension is excessively large, a cone-shaped or a bowling-shaped photoresist etching morphology trends to be formed after etching, which will cause the insufficient of the selection ratio or larger critical dimension.

In addition, if the injection barrier layer is too thick, the edge of the hard mask layer is prone to be over etched, which will cause burrs on the pattern edge of the injection barrier layer.

The above-mentioned problems will affect the effect of implantation and the device performances.

Therefore, how to solve the problem of the cone-shaped or the bowling-shaped photoresist etching morphology existed in the prior art, and to solve the problem of the generated burr on the pattern edge, so as to make the implanted ions be well distributed according to the design of the device, becomes an urgent issue to be solved.

BRIEF SUMMARY OF THE DISCLOSURE

To overcome the problems as mentioned above, it is an object of the present invention to provide a new method for forming high aspect ratio patterning structure to improve the photoresist morphology of the cone shaped or the bowling shaped and to further solve the problem of burrs on the pattern edge by utilizing a new process steps.

To achieve above object, technical solutions of the present invention are as follows:

A method for forming high aspect ratio patterning structure, comprising the steps of:

Step S01: providing a semiconductor substrate, on which from bottom to top forming a dielectric film ashing stop layer and a combination mask layer in turn, wherein, the combination mask layer from bottom to top is comprised of a first photoresist layer, a first hard mask layer and a second photoresist layer in turn;

Step S02: patterning the second photoresist layer, and further etching the first hard mask layer until entering the first photoresist layer;

Step S03: forming a second hard mask layer having a high etch selectivity ratio with the first photoresist layer on the top surface and the sidewall of the pattern received by the Step S02;

Step S04: removing the second hard mask layer from the pattern top surface and bottom by an anisotropic etch, so the second hard mask layer on the sidewall of the pattern is remained;

Step S05: etching the first photoresist layer by an anisotropic etch until reach the dielectric film ashing stop layer to form a high aspect ratio photoresist morphology;

Step S06: removing the first hard mask layer and the second hard mask layer on the pattern.

Preferably, the first photoresist layer is SOC or APF.

Preferably, in the Step S01, the first hard mask layer is formed by utilizing a low temperature chemical vapor deposition process or a spin spraying process.

Preferably, in the Step S02, a plasma etching process with a CF-based gas is employed to etch the first hard mask layer, and the morphology of the first hard mask layer is adjusted by adjusting the C/F ratio in the CF-based gas to adjust the final critical dimension.

Preferably, in the Step S03, the second hard mask layer is formed by utilizing an in-situ plasma process or a separate thin film deposition process.

Preferably, the material of the second hard mask layer is silicon oxide, silicon nitride, high molecular polymer or metal complex.

Preferably, in the in-situ plasma process, a mixed gas of silicon tetrachloride and oxygen is used as the reaction gas.

Preferably, in the Step S03, before the formation of the second hard mask layer, the height of the pattern sidewall is firstly adjusted by an anisotropic plasma etching process, while the second photoresist layer is completely consumed and removed; the reaction gases include oxygen or sulfur dioxide.

Preferably, in the Step S05, a plasma etching process is employed to etch the first photoresist layer; the reaction gases include oxygen or sulfur dioxide; in the Step S06, an isotropic plasma etching process is employed to remove the first hard mask layer and the second hard mask layer on the pattern; the reaction gases include sulfur hexafluoride or nitrogen trifluoride.

Concluded from the above technical solutions, the invention has disclosed a method for forming high aspect ratio patterning structure based on the tri-layer photoresist process. Firstly, forming a dielectric film ashing stop layer, a first photoresist layer, a first hard mask layer and a second photoresist layer on a semiconductor substrate in turn. After etching the first hard mask layer, a second hard mask layer having a high etch selectivity ratio with the first photoresist layer is formed on top surface and sidewall of the pattern by utilizing a low temperature chemical vapor deposition process, which can be a protect for the pattern sidewall during the later etching the first photoresist layer. So, the cone-shaped or the bowling-shaped photoresist morphology caused by plasma bombardment can be avoided. Therefore, the problems of the insufficient of selectivity ratio, burrs at the edge of the pattern and larger of the critical dimension can be solved, and the implanted ions can be well distributed according to the design of the device.

DETAILED DESCRIPTION OF THE EMBODIMENTS

The present invention will be described in further details hereinafter by referring to the accompanying drawings, so as to provide a better understanding of the present invention.

It should be noted that, in the following specific embodiments, when these embodiments of the present invention are described in detail, in order to clearly illustrate the structure of the present invention to facilitate explanation, the accompanying drawings are not necessarily drawn to scale, some features in the drawings may have been fragmentary enlarged, deformed or simplified. Therefore, it would be avoided to understand this as a limitation to the present invention.

Figure 1:
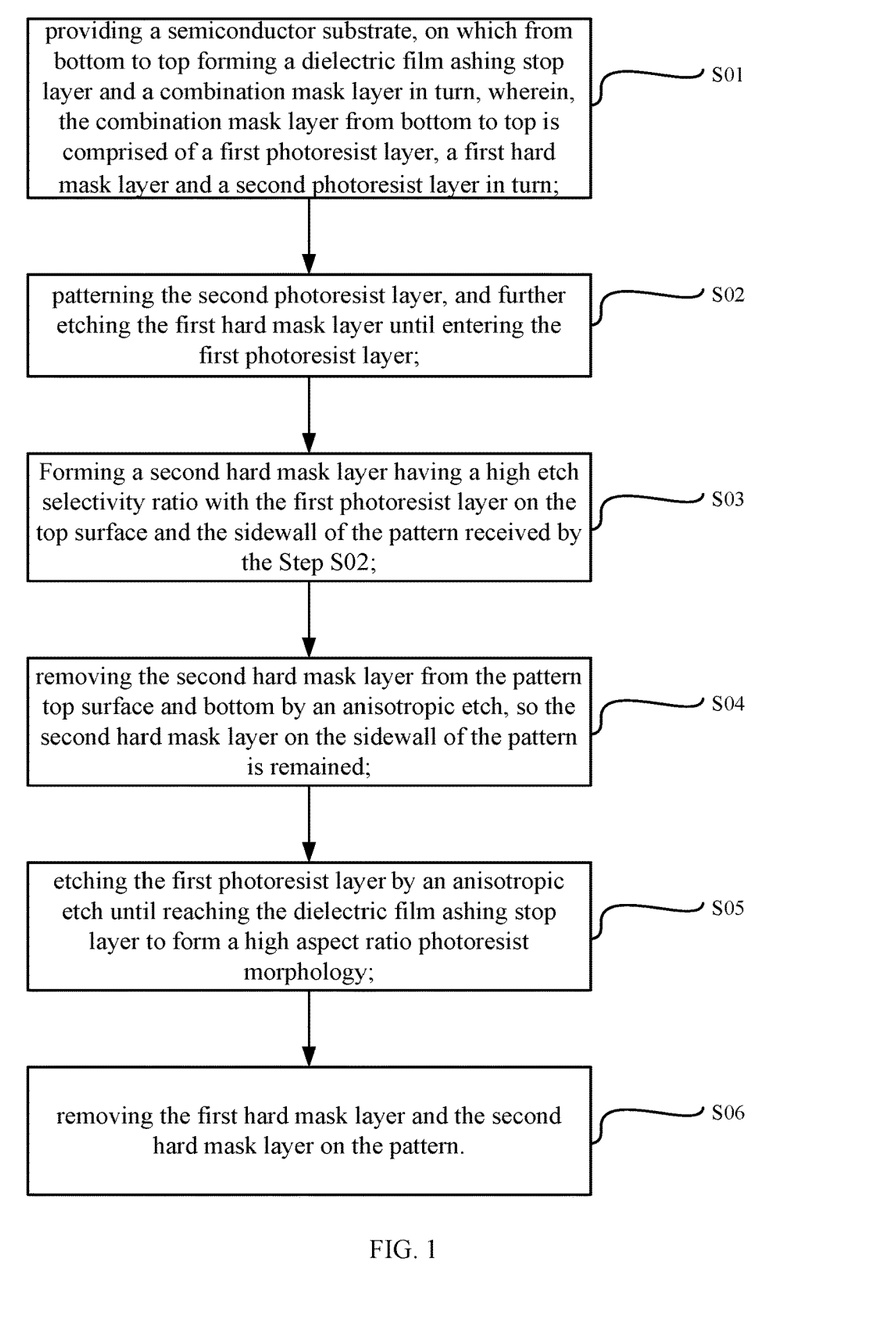
FIG. 1 is a flow sheet illustrating a method of forming high aspect ratio patterning structure in the present invention.

Referring to FIG. 1, which is a flow sheet illustrating a method of forming high aspect ratio patterning structure in the present invention. Meanwhile, referring to FIGS. 2-7, which are schematic views illustrating process steps of forming high aspect ratio patterning structure based on the method in the FIG. 1 according to a preferred embodiment of the present invention. As shown in the FIG. 1, a method for forming high aspect ratio patterning structure, comprising the steps of:

Executing Step S01: providing a semiconductor substrate, on which from bottom to top forming a dielectric film ashing stop layer and a combination mask layer in turn, wherein, the combination mask layer from bottom to top is comprised of a first photoresist layer, a first hard mask layer and a second photoresist layer in turn.

Figure 2:
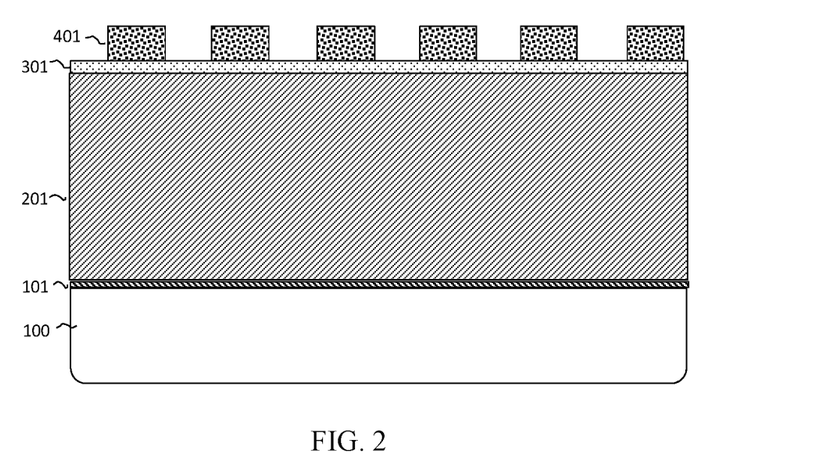
FIGS. 2-7 are schematic views illustrating process steps of forming high aspect ratio patterning structure based on the method in the FIG. 1 according to a preferred embodiment of the present invention.

Referring to FIG. 2. The semiconductor substrate can be a silicon substrate 100 in the form of a semiconductor wafer. Depositing a dielectric film ashing stop layer, a first photoresist layer, a first hard mask layer and a second photoresist layer on the silicon substrate 100 in turn. Wherein, the dielectric film ashing stop layer 101 may be formed by using silicon nitride; the first photoresist layer 201 may be formed in the form of a spin on carbon (SOC); the first hard mask layer 301 may be formed by using silicon oxide.

The silicon nitride dielectric film ashing stop layer 101 may be deposited in a furnace tube or a chemical vapor deposition apparatus. The thickness of the silicon nitride dielectric film ashing stop layer 101 is determined by the thermal budget of the device, between 50 and 500 Å, preferably between 300 and 500 Å. The film quality of the silicon nitride dielectric film ashing stop layer 101 is determined in accordance with the film qualities of the SOC first photoresist layer 201 and the silicon oxide first hard mask layer 301 (and the second hard mask layer). This is because that in the subsequent removal steps for the first hard mask layer, the second hard mask layer and the SOC, it is necessary to select an etching process with a high selectivity ratio for the silicon nitride dielectric film ashing stop layer 101 to protect the silicon substrate.

In the embodiment, the thickness of the SOC first photoresist layer 201 may be decided in accordance of the subsequent implantation process, about between 2 and 10 um. Since the SOC is a carbon-containing organic material that is prone to volatilize at high temperatures, it is necessary to deposit a first hard mask layer on the SOC by utilizing a low temperature chemical vapor deposition process or a spin spraying process. In the embodiment, the material of the first hard mask layer 301 is silicon oxide. The thickness of the silicon oxide first hard mask layer 301 is about between 500 and 5000 Å, preferably between 500 and 1000 Å, in accordance with the loss of the silicon oxide film caused by the etchant. Silicon oxide has a high selectivity to the SOC. The thickness of the second photoresist layer 401 is generally between 2000 Å and 4000 Å, which should be sufficient large to withstand the etching of the etchant during the etching of the first hard mask layer 301, and satisfy enough lithographic process windows for the critical dimension thereof.

As an alternative embodiment, the material of the dielectric film ashing stop layer 101 may be also silicon oxide; the first photoresist layer 201 may be formed in the form of a advanced pattern film (APF); the material of the first hard mask layer 301 may be also silicon nitride deposited by a low temperature chemical vapor deposition process, or silicon coated by a spin spraying process.

Executing Step S02: patterning the second photoresist layer, and further etching the first hard mask layer until enter the first photoresist layer.

Figure 3:
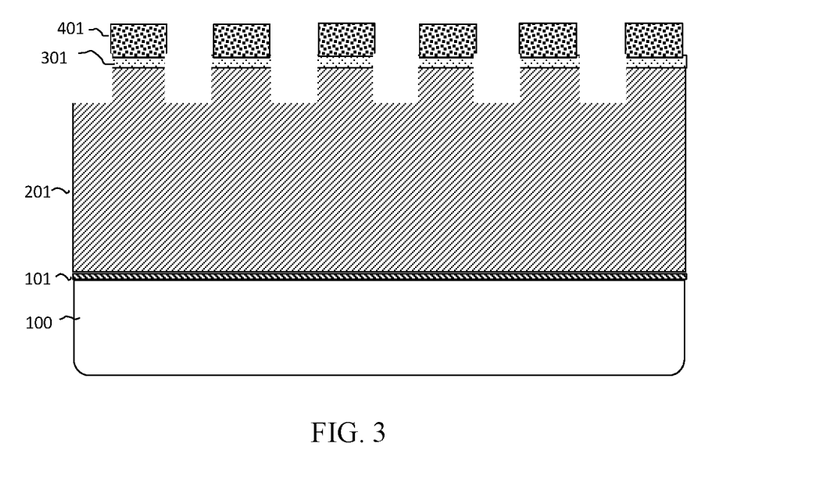

Referring to FIG. 3. A plasma etching process is employed to open the silicon oxide first hard mask layer 301. A CF-based gas is used. If the etched critical dimension is required to be adjusted, the C/F ratio in the CF-based gas can be adjusted to adjust the morphology of the first hard mask layer.

Executing Step S03: forming a second hard mask layer having a high etch selectivity ratio with the first photoresist layer on top surface and sidewall of the pattern received by the Step S02.

In order to avoid the appearance of the cone-shaped or bowling-shaped photoresist morphology at the high aspect ratio patterning structure, the present invention provides an optimized method for protecting the upper side of the pattern and realizes the effective protection by forming a second hard mask layer on the top surface and the sidewall of the pattern.

Figure 4:
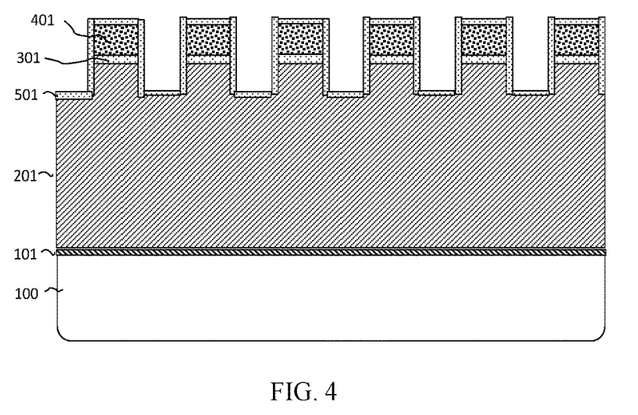

Referring to FIG. 4. A silicon oxide second hard mask layer 501 is grown by utilizing an in-situ plasma process in an etching chamber, which covers on the top surface and sidewall of the second photoresist layer 401, the sidewall of the silicon oxide first hard mask layer 301, and the exposed surface and sidewall of the SOC first photoresist layer 201. The reaction gas is a mixed gas of silicon tetrachloride ($SiCl_4$) and oxygen ($O_2$). The flow ratio of $SiCl_4$ and $O_2$ is 1:2. The reaction pressure is between 5 mt and 100 mt. The RF power for the upper electrode is above 1000 W, and the RF power for the lower electrode is between 0 and 50 W. The reaction temperature is lower than 150° C. The grown silicon oxide may be compatible with either the first photoresist layer 401 or the SOC first photoresist layer 201, and has a high etch selectivity ratio. Therefore, in this Step, a silicon oxide protective layer is formed on the pattern sidewall and may have a thickness of between 100 Å and 2000 Å. In addition, the second hard mask layer may be also formed by utilizing a separate thin film deposition process. After deposition of the silicon oxide second hard mask layer 501, top overhang phenomenon may arise. The second hard mask layer may also be silicon nitride, high molecular polymer or metal complex.

Executing Step S04: removing the second hard mask layer from the pattern top surface and bottom by an anisotropic etch, so the second hard mask layer on the sidewall of the pattern is remained.

Figure 5:
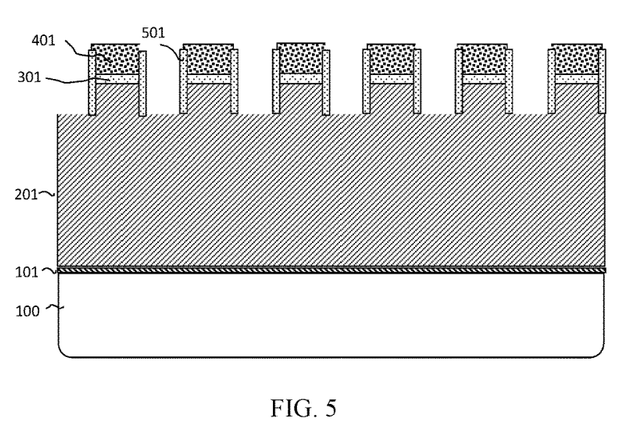

Referring to FIG. 5. The silicon oxide second hard mask layer 501 in the horizontal direction (i.e., surface) is anisotropically etched under the etching conditions of the silicon oxide film. So, the silicon oxide second hard mask layer 501 in the vertical direction (i.e., sidewall) is left.

Executing Step S05: etching the first photoresist layer by an anisotropic etch until reach the dielectric film ashing stop layer to form a high aspect ratio photoresist morphology.

Figure 6:
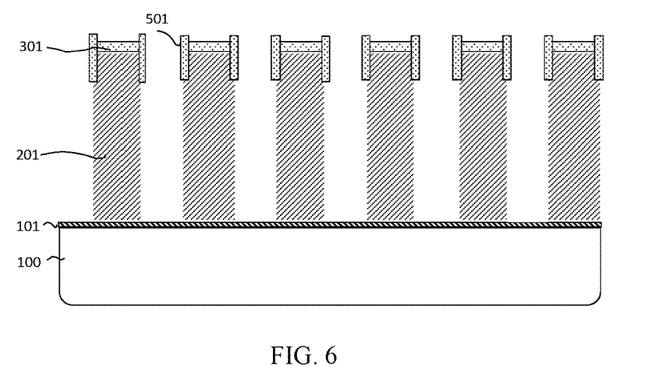

Referring to FIG. 6. A plasma etching process is employed to etch the first photoresist layer 201, wherein, the reaction gases include oxygen or sulfur dioxide. The SOC first photoresist layer 201 has a high selectivity to the silicon oxide first hard mask layer 301 and the silicon nitride dielectric film ashing stop layer 101. During the etching process, the SOC first photoresist layer 201 in the lithographic exposure region is etched until reach the dielectric film ashing stop layer 101, wherein, the etching depth is about 4 um. In the process, the second photoresist layer 401 may be completely consumed and removed shown in the FIG. 6, or residues also be completely removed in the later process.

Executing Step S06: removing the first hard mask layer and the second hard mask layer on the pattern.

Figure 7:
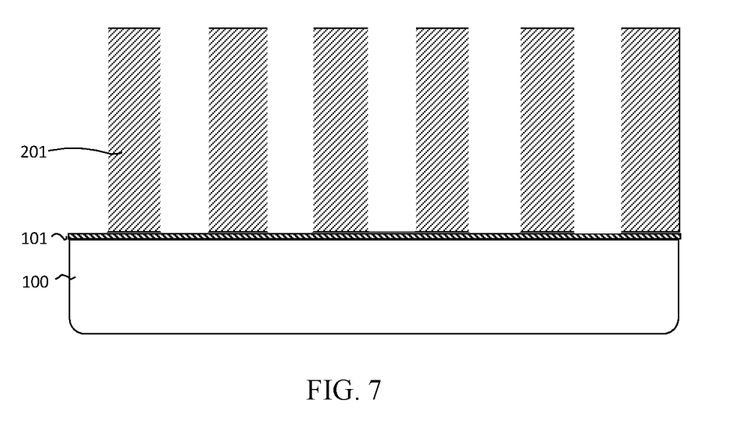

Referring to FIG. 7. The remained silicon oxide first hard mask layer 301 on the top of the pattern and the remained silicon oxide second hard mask layer 501 on the sidewall of the pattern may be etched and removed by using an isotropic plasma etching process. The photoresist remaining in the previous step may also be removed in this step.

The role of the silicon nitride dielectric film ashing stop layer 101 is to prevent plasma damage to the silicon substrate and diffusion of the metal ions into the active region of the device during the process. If the substrate is insensitive to plasma damage, the dielectric film ashing stop layer may be absent, and thus etching is stopped until reach the substrate 100.

The etching gas of isotropically etching $SiO_2$ may include $SF_6$ or $NF_3$, and so on. In addition, $CF_4$ can also be used under certain conditions.

In order to ensure high selectivity and isotropic etching of the silicon nitride dielectric film ashing stop layer 101, the RF power for the lower electrode (providing a negative bias for plasma bombardment) in the lower part of the reaction chamber can be set as 0 W.

Figure 8:
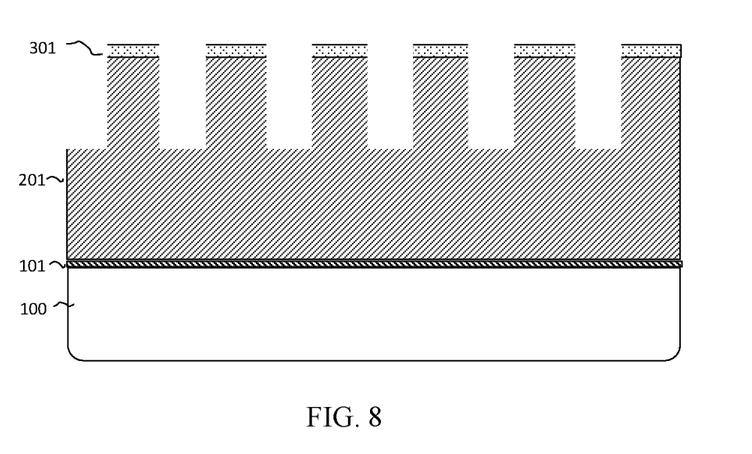
FIGS. 8-10 are schematic views illustrating process steps of forming high aspect ratio patterning structure based on the method in the FIG. 1 according to another preferred embodiment of the present invention.
Figure 9:
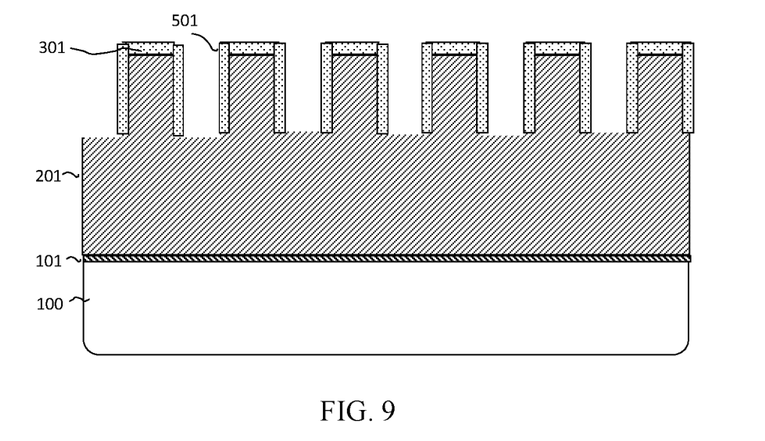
Figure 10:
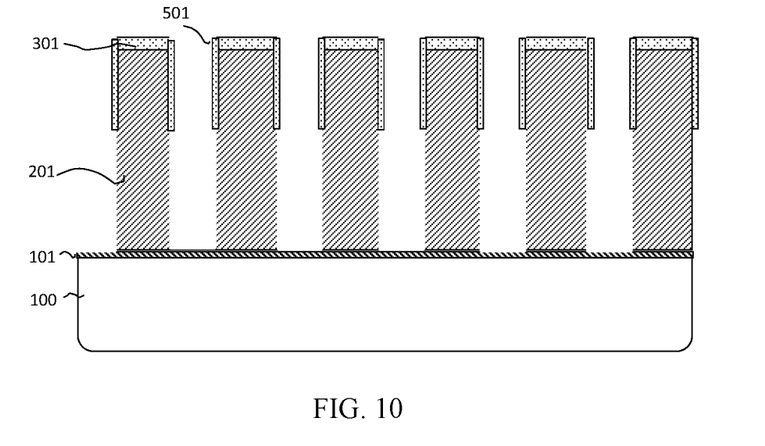

The height of the sidewall of the pattern obtained in the Step S02 can be accurately adjusted before executing Step S03. Referring to FIGS. 8-10, which are schematic views illustrating process steps of forming high aspect ratio patterning structure based on the method in the FIG. 1 according to another preferred embodiment of the present invention. An anisotropic plasma etch step with $O_2$ or $SO_2$ as the primary etch gas is added to precisely adjust the height of the sidewall of the pattern obtained in the Step S02. Under the above etching conditions, the first photoresist layer 401 is completely consumed and removed, at the same time, the SOC first photoresist layer 201 is etched downward to obtain the sidewall with the desired height. The silicon oxide first hard mask layer 301 can continue to serve as a mask layer to protect the underlying the SOC first photoresist layer 201 from being etched, due to high selectivity of the SOC first photoresist layer 201 to the silicon oxide first hard mask layer 301.

The height of the sidewall required be protected at the top of the pattern is typically between 200 Å and 8000 Å.

Referring to FIG. 9. A second silicon oxide hard mask layer 501 having a high etch selectivity ratio with the SOC first photoresist layer 201 is formed on the surface and sidewall of the pattern (i.e., executing Step S03). Then, the silicon oxide second hard mask layer 501 positioned at top surface and bottom of the pattern is etched and removed by using an anisotropic etching process. So, the second silicon oxide hard mask layer 501 positioned at the sidewall of the pattern is left. The silicon oxide second hard mask layer 501 and the silicon oxide first hard mask layer 301 will be stacked together.

In the embodiment, the silicon oxide second hard mask layer 501 and the silicon oxide first hard mask layer 301 will be stacked together since the second photoresist layer 401 has been completely removed in the previous process step. Therefore, the thickness of the silicon oxide on top surface of the pattern is larger than that at the bottom of the pattern. In addition, due to the absence of the first photoresist layer between the second hard mask layer and the first hard mask layer, the process stability during etching can also be improved.

During the process of executing Step S04, the amount of etching should be paid special attention. This is because that the over-etching of the silicon oxide second hard mask layer 501 will consume a certain amount of the silicon oxide first hard mask layer 301. It is necessary to control the etching amount so as to leave a sufficient silicon oxide first hard mask layer 301 as a mask layer in the subsequent etching process of the first photoresist layer 201.

Referring to FIG. 10. The SOC first photoresist layer 201 of the pattern obtained in the FIG. 9 is continually etched by an anisotropic etch until reach the silicon nitride dielectric film ashing stop layer 101 to form a high aspect ratio photoresist morphology (i.e., executing Step S05). Further, the final pattern of the FIG. 7 is obtained by executing Step S06.

In summary, the invention has disclosed a method for forming high aspect ratio patterning structure based on the tri-layer photoresist process. Firstly, forming a dielectric film ashing stop layer, a first photoresist layer, a first hard mask layer and a second photoresist layer on a semiconductor substrate in turn. After etching the first hard mask layer, a second hard mask layer having a high etch selectivity ratio with the first photoresist layer is formed on top surface and sidewall of the pattern by utilizing a low temperature chemical vapor deposition process, which can be a protect for the pattern sidewall during the later etching the first photoresist layer. So, the cone-shaped or the bowling-shaped photoresist morphology caused by plasma bombardment can be avoided. Therefore, the problems of the insufficient of selectivity ratio, burrs at the edge of the pattern and larger of the critical dimension can be solved, and the implanted ions can be well distributed according to the design of the device.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A method for forming high aspect ratio patterning structure, comprising the steps of:
    Step S01: providing a semiconductor substrate, on which from bottom to top forming a dielectric film ashing stop layer and a combination mask layer in turn, wherein, the combination mask layer from bottom to top is comprised of a first photoresist layer, a first hard mask layer and a second photoresist layer in turn;
    Step S02: patterning the second photoresist layer, and further etching the first hard mask layer until entering the first photoresist layer;
    Step S03: forming a second hard mask layer having a higher etch selectivity ratio compared with the first photoresist layer on the top surface and the sidewall of the pattern received by the Step S02;
    Step S04: removing the second hard mask layer from the pattern top surface and bottom by an anisotropic etch, so the second hard mask layer on the sidewall of the pattern is remained;
    Step S05: etching the first photoresist layer by an anisotropic etch until reaching the dielectric film ashing stop layer to form a photoresist morphology;
    Step S06: removing the first hard mask layer and the second hard mask layer on the pattern.

2. The method of claim 1, wherein, in the Step S01, the first photoresist layer is spin-on-carbon.

3. The method of claim 1, wherein, in the Step S01, the first hard mask layer is formed by utilizing a chemical vapor deposition process or a spin spraying process.

4. The method of claim 1, wherein, in the Step S02, a plasma etching process with a CF-based gas is employed to etch the first hard mask layer, and the morphology of the first hard mask layer is adjusted by adjusting the C/F ratio in the CF-based gas to adjust a final critical dimension.

5. The method of claim 1, wherein, in the Step S03, the second hard mask layer is formed by utilizing an in-situ plasma process or a separate thin film deposition process.

6. The method of claim 1, wherein the material of the second hard mask layer is silicon oxide, silicon nitride, molecular polymer or metal complex.

7. The method of claim 5, wherein the material of the second hard mask layer is silicon oxide, silicon nitride, molecular polymer or metal complex.

8. The method of claim 5, wherein, in the in-situ plasma process, a mixed gas of silicon tetrachloride and oxygen is used as the reaction gas.

9. The method of claim 1, wherein, in the Step S03, before the formation of the second hard mask layer, the height of the pattern sidewall is firstly adjusted by an anisotropic plasma etching process, while the second photoresist layer is completely consumed and removed; reaction gases include oxygen or sulfur dioxide.

10. The method of claim 1, wherein, in the Step S05, a plasma etching process is employed to etch the first photoresist layer; reaction gases include oxygen or sulfur dioxide; in the Step S06, an isotropic plasma etching process is employed to remove the first hard mask layer and the second hard mask layer on the pattern; the reaction gases include sulfur hexafluoride or nitrogen trifluoride.

* * * * *